(12) United States Patent
Hando et al.

(10) Patent No.: US 9,119,333 B2
(45) Date of Patent: Aug. 25, 2015

(54) MULTILAYER WIRING BOARD

(75) Inventors: Takuya Hando, Inuyama (JP);
Masahiro Inoue, Konan (JP); Hajime Saiki, Konan (JP); Atsuhiko Sugimoto, Kagamigahara (JP); Hidetoshi Wada, Komaki (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 38 days.

(21) Appl. No.: 13/399,547

(22) Filed: Feb. 17, 2012

(65) Prior Publication Data

US 2012/0211271 A1 Aug. 23, 2012

(30) Foreign Application Priority Data

Feb. 21, 2011 (JP) ................................. 2011-035004

(51) Int. Cl.
*H05K 3/40* (2006.01)
*H01L 23/498* (2006.01)
(Continued)

(52) U.S. Cl.
CPC .......... *H05K 3/4007* (2013.01); *H01L 21/6835* (2013.01); *H01L 23/49816* (2013.01); *H05K 3/4682* (2013.01); *H01L 23/49822* (2013.01); *H01L 24/16* (2013.01); *H01L 24/81* (2013.01); (Continued)

(58) Field of Classification Search
CPC ....... H05K 1/11; H05K 1/184; H05K 3/4007; H01L 21/44
USPC .......... 174/250–268; 361/792, 760, 767–771, 361/777, 779; 29/829, 846; 257/737, 750, 257/751, 772
See application file for complete search history.

(56) References Cited

U.S. PATENT DOCUMENTS 5,977,783 A * 11/1999 Takayama et al. ........ 324/755.01
6,217,987 B1 * 4/2001 Ono et al. ..................... 428/209
(Continued)

FOREIGN PATENT DOCUMENTS

CN 101286456 A 10/2008
JP 3-268385 A 11/1991
(Continued)

OTHER PUBLICATIONS

SIPO, Notification of First Office Action issued in corresponding Chinese application 201210041461.4, issued Dec. 17, 2014.
(Continued)

*Primary Examiner* — Zachary M Pape
*Assistant Examiner* — Douglas Burtner
(74) *Attorney, Agent, or Firm* — Stites & Harbison PLLC; Jeffrey A. Haeberlin

(57) ABSTRACT

A multilayer wiring board including a build-up layer, formed from one or more conductor and resin insulation layers that are layered one on top of the other, having conductive pads formed on a surface of at least one resin insulation layer so as to project from the surface are provided. The conductive pads may each include a columnar portion situated at a lower part thereof and a convex portion situated at a higher part thereof, wherein a surface of the convex portion may assume a continual curved shape. A solder layer may be formed over an upper surface of the conductive pads. Certain embodiments make it possible to minimize or eliminate the concentration of stress on the conductive pads, and may inhibit the occurrence of defective connections to a semiconductor element and infliction of damage to the conductive pads.

3 Claims, 8 Drawing Sheets

(51) Int. Cl.
  *H01L 23/00* (2006.01)
  *H01L 21/683* (2006.01)
  *H05K 3/46* (2006.01)
  *H05K 3/00* (2006.01)

(52) U.S. Cl.
  CPC ............. *H01L 2221/68345* (2013.01); *H01L 2224/16225* (2013.01); *H01L 2224/81192* (2013.01); *H01L 2924/01084* (2013.01); *H05K 3/0097* (2013.01); *H05K 2201/0367* (2013.01)

(56) References Cited

U.S. PATENT DOCUMENTS

| | | | |
|---|---|---|---|
| 6,294,316 B1* | 9/2001 | Kaneda et al. | 430/314 |
| 7,173,188 B2* | 2/2007 | Endo et al. | 174/94 R |
| 7,597,929 B2 | 10/2009 | Kyozuka | |
| 7,875,804 B1* | 1/2011 | Tronnes et al. | 174/254 |
| 7,882,626 B2 | 2/2011 | Murayama et al. | |
| 7,977,580 B2 | 7/2011 | Ueno et al. | |
| 8,188,380 B2 | 5/2012 | Kawai et al. | |
| 8,418,360 B2 | 4/2013 | Kawai et al. | |
| 2001/0042304 A1* | 11/2001 | Sato | 29/831 |
| 2002/0036227 A1* | 3/2002 | Milewski et al. | 228/246 |
| 2002/0163084 A1* | 11/2002 | Ohtsuki et al. | 257/772 |
| 2003/0049884 A1* | 3/2003 | Lutz | 438/106 |
| 2004/0238953 A1* | 12/2004 | Murtuza et al. | 257/737 |
| 2007/0190237 A1 | 8/2007 | Kyozuka | |
| 2008/0258300 A1* | 10/2008 | Kobayashi et al. | 257/737 |
| 2009/0223046 A1 | 9/2009 | Murayama et al. | |
| 2009/0294156 A1 | 12/2009 | Ueno et al. | |
| 2010/0071949 A1* | 3/2010 | Murakami et al. | 174/261 |
| 2010/0163293 A1 | 7/2010 | Kawai et al. | |
| 2012/0061347 A1 | 3/2012 | Kawai et al. | |
| 2012/0186863 A1* | 7/2012 | Inoue et al. | 174/257 |

FOREIGN PATENT DOCUMENTS

| | | |
|---|---|---|
| JP | 2004-47510 A | 2/2004 |
| JP | 2007-214427 A | 8/2007 |
| JP | 2009-64973 A | 3/2009 |
| JP | 2009-212140 A | 9/2009 |
| JP | 2009-239205 A | 10/2009 |
| JP | 2009-289848 A | 12/2009 |
| JP | 2010-157718 A | 7/2010 |

OTHER PUBLICATIONS

Japanese Patent Office, Notification of Reason for Refusal issued in corresponding Japanese application 2011-035004, dispatched Jan. 21, 2014.

* cited by examiner

MULTILAYER WIRING BOARD

CROSS REFERENCE TO RELATED APPLICATIONS

The present application claims priority from Japanese Patent Application No. 2011-035004, which was filed on Feb. 21, 2011, the disclosure of which is herein incorporated by reference in its entirety.

BACKGROUND OF THE INVENTION

1. Field of the Invention

The present invention relates to a multilayer wiring board. More particularly, certain embodiments of the present invention relate to multilayer wiring boards comprising conductive pads having a columnar portion at a lower part thereof and a convex portion at an upper part thereof.

2. Description of Related Art

A multilayer wiring board has generally been used as a package to be mounted with electronic components. In the multilayer wiring board, build-up layers are formed by stacking, one on top of the other, a resin insulation layer and a conductor layer on each side of a core board. In the multilayer wiring board, the core board is manufactured from, for instance, a resin including glass fibers, and plays a role of reinforcing the build-up layer by means of its high rigidity.

However, since core boards are thickly formed, core boards hinder miniaturization of the multilayer wiring boards. Further, wire length inevitably becomes longer since a through hole conductor for electrically interconnecting the build-up layers must be provided in the core board, which in turn may result in deterioration of high-frequency signal transmission performance.

Consequently, there has recently been developed a so-called coreless multilayer wiring board that is not provided with a core board and that has a structure suitable for miniaturization and enabling enhancement of high-frequency signal transmission performance (JP-A-2009-289848 and JP-A-2007-214427). In relation to such a coreless multilayer wiring board, a build-up layer is formed on a support whose surface is covered with, for instance, a peel sheet manufactured by layering two peelable metallic films one on top of the other. Subsequently, the build-up layer is separated from the support along a peel interface of the peel sheet, manufacturing an intended multilayer wiring board.

In the meantime, conductive pads that are situated on a semiconductor element mount area of the multilayer wiring board and that are intended to be connected to a semiconductor element through flip-chip bonding are formed beneath a resist layer that is located at the topmost level so as to become exposed through openings in the resist layer. Further, in some cases, the conductive pads are formed so as to protrude from the surface of the resist layer (JP-A-2009-212140). In such a case, the conductive pad is usually formed into a rectangular shape. When an attempt is made to feed solder to the conductive pads having such a shape to thereby form a solder layer and attach a multilayer wiring board to a semiconductor element by means of flip-chip bonding, stress concentrates on sharp edges of the respective conductive pads.

As a consequence, cracks open in the conductive pads, which may cause defective connections to the semiconductor element or inflict damage to the conductive pads.

BRIEF SUMMARY OF THE INVENTION

An objective of embodiments of the present invention is directed toward a multilayer wiring board including a build-up layer made up of a conductor layer and a resin insulation layer that are layered one on top of the other; conductive pads formed on a surface of at least one resin insulation layer so as to project from the surface; and a solder layer formed over an upper surface of the conductive pad. The present invention aims at preventing the concentration of stress on conductive pads, to thus prevent the occurrence of a defective connections to a semiconductor element and infliction of damage to conductive pads.

In order to accomplish the objective, embodiments of the present invention relate to a multilayer wiring board comprising:

a build-up layer including a conductor layer and a resin insulation layer that are alternately layered; and a conductive pad that is formed so as to project from a surface of the resin insulation layer and having a columnar portion at a lower part thereof and a convex portion at an upper part thereof, wherein a surface of the convex portion of the conductive pad forms a continual curved shape.

According to embodiments of the present invention, the conductive pads projecting from the surface of the resin insulation layer are formed from a columnar portion located at or in the lower part of the conductive pads and a convex portion that is located at or in the upper part of the conductor pads and that has a continual curved surface. Consequently, the conductive pads do not have sharp edges, such as those found in the related-arts' conductive pads. Even when solder is fed to the conductive pad, to thus flip-chip bond the multilayer wiring board to the semiconductor element, stress will not concentrate on the conductive pad. Therefore, occurrence of a defective connection to a semiconductor element and infliction of damage to the conductive pad can be prevented.

Even when the conductive pad is formed from only a convex portion having a continual curved shape (continual curved surface), the conductive pad does not have a sharp edge, so that yielding a working effect, such as that mentioned previously, can also be expected. However, if the thickness of the end of the convex portion becomes smaller, stress will concentrate on the end having the smallest thickness. As a consequence, a defective connection to the semiconductor element and infliction of damage to the conductive pad may occur, as in the related art. However, so long as the conductive pad is formed from a columnar portion located in a lower part and a convex portion located in an upper part in the way as mentioned above, a decrease in thickness of the end of each of the convex portions, which would otherwise be caused by presence of the columnar portion in a lower part, can be prevented. Therefore, the foregoing disadvantage is not yielded.

In a case where the multilayer wiring board and the semiconductor element are attached together by way of the conductive pad, each of which has a configuration such as that mentioned above, by means of flip-chip bonding, it is preferable to form a solder layer so as to cover the entirety of the conductive pad. In this case, a sufficient quantity of solder can be fed to the conductive pad. Hence, the multilayer wiring board can be flip-chip bonded to the semiconductor element in a more reliable manner.

Specifically, certain embodiments of the present invention further comprise a solder layer covering the entire conductive pad.

Moreover, in a further embodiment of the present invention, the multilayer wiring board further comprises a barrier metal layer formed between the conductive pad and the solder layer so as to cover the entire conductive pad, wherein the solder layer covers the conductive pad and the barrier metal layer that covers the entire conductive pad, and wherein a coating thickness of the barrier metal layer formed on a side end face of the conductive pad situated on the resin insulation layer is made greater than a coating thickness of the barrier metal layer formed on a surface of the conductive pad situated at a higher position than the side end face.

Of course, with regard to this further embodiment, in certain instances the coating thickness of the barrier metal layer formed on a side end face of the conductive pad need not be made greater than a coating thickness of the barrier metal layer formed on a surface of the conductive pad.

Still further embodiments may comprise the multilayer wiring board, wherein the solder layer is formed only on the barrier metal layer and does not contact the resin insulation layer.

As mentioned above, when the solder layer is formed so as to cover the conductive pad its entirety, adhesion between the solder layer and the resin insulation layer, particularly adhesion between the solder layer and the resist layer, is often considerably low. Therefore, peeling may take place between the solder layer and the resin insulation layer prior to or subsequent to flip-chip bonding of the multilayer wiring board to the semiconductor element, which may cause a defective connection to a semiconductor element, or the like.

However, when the barrier metal layer is formed between the conductive pad and the solder layer, as mentioned above, adhesion of the barrier metal layer to the resin insulation layer is sufficiently higher than adhesion of the solder layer to the resin insulation layer. The coating thickness of the barrier metal layer formed on the side end face of each conductive pad situated on the resin insulation layer is made greater than the coating thickness of the barrier metal layer formed over the surface of the conductive pad formed at a higher position with respect to the side end face. Accordingly, the foregoing enhancement of adhesion becomes more noticeable.

Consequently, peeling is reduced or eliminated between the barrier metal layer and the resin insulation layer prior to and subsequent to flip-chip bonding of the multilayer wiring board to the semiconductor element. As a consequence, peeling is also minimized or reduced between the solder layer and the resin insulation layer. For these reasons, occurrence of a defective connection to a semiconductor element, or the like, can be prevented.

So long as the solder layer is formed solely over the barrier metal layer so as not to contact the resin insulation layer, an end of the solder layer remaining in contact with the resin insulation layer, for instance, can be prevented from being partially peeled off.

As mentioned above, embodiments of the present invention make it possible to prevent the concentration of stress on conductive pads and the occurrence of defective connections to a semiconductor element and damage to the conductive pads with a multilayer wiring board including: a build-up layer made up of a conductor layer and a resin insulation layer that are layered one on top of the other; a conductive pad formed on a surface of at least one resin insulation layer so as to project from the surface; and a solder layer formed over an upper surface of the conductive pad.

BRIEF DESCRIPTION OF THE DRAWINGS

Illustrative aspects of the invention will be described in detail with reference to the following figures wherein.

DETAILED DESCRIPTION OF EXEMPLARY EMBODIMENTS OF THE INVENTION

Embodiments of the present invention are now hereunder described by reference to the drawings.

Multilayer Wiring Board

Figure 1:
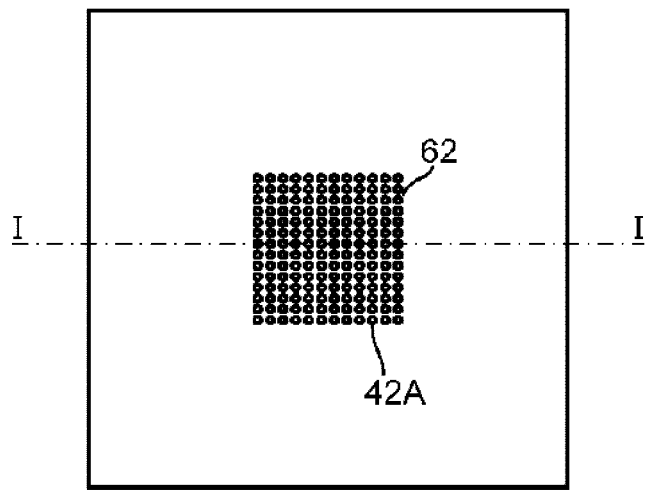
FIG. 1 is a plan view of a multilayer wiring board of a first embodiment of the present invention.
Figure 2:
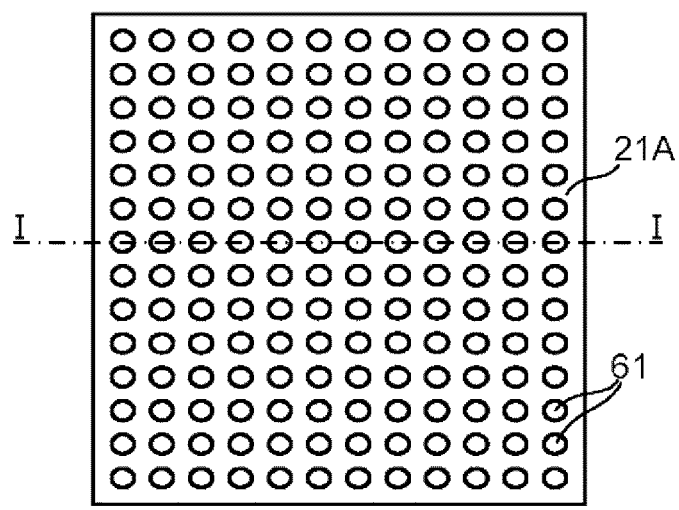
FIG. 2 is a plan view of the multilayer wiring board of the first embodiment of the present invention.
Figure 3:
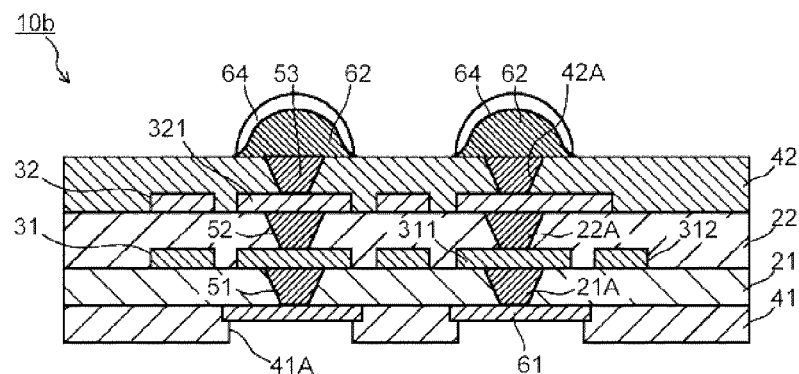
FIG. 3 is an enlarged cross sectional view showing a portion of the multilayer wiring board that is shown in FIGS. 1 and 2 and that is taken along line I-I.
Figure 4:
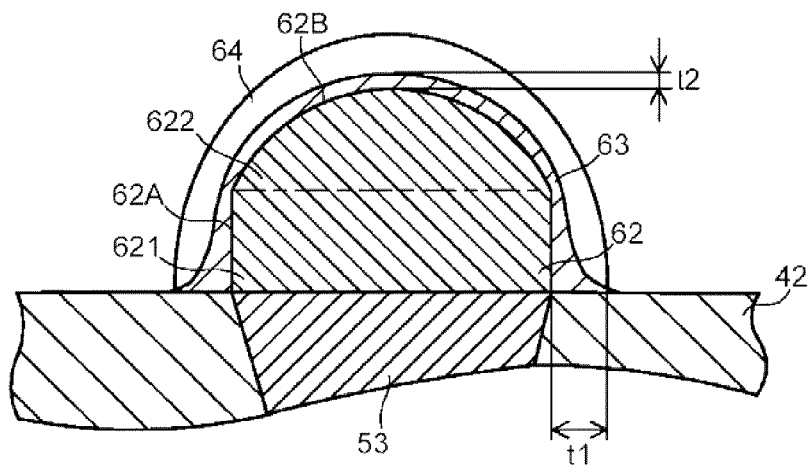
FIG. 4 is an enlarged cross sectional view showing a neighborhood of the conductive pad shown in FIG. 3.

FIGS. 1 and 2 are plan views of a multilayer wiring board of a first embodiment of the present invention. FIG. 1 shows a state of the multilayer wiring board when viewed from above. FIG. 2 shows a state of the multilayer wiring board when viewed from below. FIG. 3 is a drawing showing, in an enlarged manner, a portion of a cross section of the multilayer wiring board that is shown in FIGS. 1 and 2 and that is taken along line I-I. FIG. 4 is an enlarged cross sectional view showing a neighborhood of the conductive pad shown in FIG. 3.

A multilayer wiring board which will be described below is an exemplary embodiment that illustrates certain characteristics of the present invention. No specific limitations are imposed on the multilayer wiring board, so long as the multilayer wiring board includes a build-up layer made up of a conductor layer and a resin insulation layer that are layered one on top of the other and conductive pads that are formed on a surface of the resin insulation layer so as to project from the surface and that each have a columnar portion located in a lower part and a convex portion located in an upper part, and so long as a surface of the convex portion of each of the conductive pads assumes a continual curved shape.

In a multilayer wiring board 10 shown in FIGS. 1 through 3, a first resin insulation layer 21 and a second resin insulation layer 22 that are formed from a thermosetting resin composition including, as required, a silica filler, and first conductor layers 31 and second conductor layers 32 that are formed from an electrical conductor, like copper, are stacked into respective predetermined patterns one on top of the other. A first resist layer 41 that includes openings 41A and that is formed from, for instance, an epoxy-based resist material is formed over the first resin insulation layer 21. A second resist layer 42 that includes openings, or via holes 42A, and that is formed from, for instance, an epoxy-based resist material, is formed over the second resin insulation layer 22.

At least the first resist layer 41, the first resin insulation layer 21, the first conductor layers 31, the second resin insulation layer 22, the second conductor layers 32, and the second resist layer 42, which are stacked one on top of the other, make up a build-up layer.

Openings, namely, via holes 21A and 22A are respectively formed in the first resin insulation layer 21 and the second resin insulation layer 22 so as to penetrate through the respective resin insulation layers in their thicknesswise direction. Further, via conductors 51 and 52 are formed so as to bury the via holes 21A and 22A. The via conductor 52 electrically connects the first conductor layer 31 to the second conductor layer 32.

In the depicted embodiment, areas 311 of the first conductor layers 31 remaining in electrical contact with the respective via conductors 51 make up via lands. Areas 312 of the first conductor layers 31 remaining out of electrical contact with the via conductors 51 make up an interconnection layer. Likewise, areas 321 of the second conductor layers 32 remaining in electrical contact with the via conductors 52 make up via lands, and areas 322 remaining out of electrical contact with the via conductors 52 make up an interconnection layer.

First conductive pads 61 formed on the first resin insulation layer 21 remain exposed through the respective openings 41A of the first resist layer 41. The first conductor layers 31 and the first conductive pads 61 are electrically connected by means of the via conductors 51.

The first conductive pads 61 are utilized as backside lands (e.g., LGA pads) for connecting the multilayer wiring board 10 to a motherboard and are arranged in a rectangular pattern on a back side of the multilayer wiring board 10.

Via conductors 53 are formed within the respective via holes 42A of the second resist layer 42 in such a way that the via holes 42A are buried. Further, raised second conductive pads 62 are formed so as to project from a surface of the second resist layer 42 and continue from the via conductors 53. The second conductor layers 32 and the conductive pads 62 are electrically connected together by means of the via conductors 53.

The second conductive pads 62 are pads (e.g., FC pads) for flip-chip connection with an unillustrated semiconductor element and make up a semiconductor element mount area. The second conductive pads 62 are arranged in a rectangular pattern at a substantial center of the surface of the multilayer wiring board 10.

As is apparent from the above descriptions, the first conductive pads 61, the first conductor layers 31, the second conductor layers 32, and the second conductive pads 62 are electrically connected together in a thicknesswise direction of the multilayer wiring board 10 by means of the via conductors 51, 52, and 53.

As shown in FIGS. 3 and 4, each of the second conductive pads 62 has a columnar portion 621 located in a lower part of the second conductive pad and a convex portion 622 that is situated in an upper part of the same and that has a continually curved surface. A barrier metal layer 63 formed from an Ni/Au plating film, or the like, is formed so as to cover entirety of each of the second conductive pads 62. Further, a solder layer 64 formed from solder that does not substantially include Pb, for instance, Sn—Ag, Sn—Cu, Sn—Ag—Cu, and Sn—Sb, is made so as to cover the barrier metal layer 63.

Moreover, a coating thickness t1 of the barrier metal layer 63 formed over a side end face 62A of each of the second conductive pads 62 situated on the second resist layer 42 is made greater than a coating thickness t2 of the barrier metal layer 63 formed on a surface 62B of each of the second conductive pads 62 situated higher than the side end face 62A. Further, the solder layer 64 is formed solely over the barrier metal layer 63 so as not to contact the second resist layer 42.

The multilayer wiring board 10 can be formed to a size of, for instance, 200 mm×200 mm×0.8 mm.

As shown in FIGS. 3 and 4, the second conductive pads 62 are formed so as to project from the surface of the second resist layer 42. Each of the second conductive pads 62 are made up of the columnar portion 621 situated in a lower part of the second conductive pad and the convex portion 622 that is situated in an upper part of the same and that has a continual curved surface. Consequently, since each of the second conductive pads 62 do not have a sharp edge, stress will not concentrate on the conductive pads even when solder is fed to the second conductive pads 62 to attach the multilayer wiring board 10 to the semiconductor element by means of flip-chip bonding. Therefore, occurrence of a defective connection to a semiconductor element and infliction of damage to the second conductive pads 62 can be prevented.

Even when each of the second conductive pads 62 are made up of only the convex portion 622 having a continually curved surface, a working effect, like that mentioned previously, can be expected because the second conductive pads 62 do not have any sharp edges. However, when a thickness of an end of the convex portion 622 becomes smaller, stress will concentrate on the end having a smaller thickness. As a consequence, a defective connection to a semiconductor element or damage to the second conductive pads 62 may occur, as in the related art. However, in the present embodiment, each of the second conductive pads 62 is made up of the columnar portion 621 situated in the lower part of the second conductive pad 62 and the convex portion 622 situated in the upper part of the same. Since the thickness of the end of the convex portion 622 will not become reduced because of presence of the columnar portion 621 in the lower part of the second conductive pad 62, the aforementioned disadvantage will not arise.

In the embodiment, since the solder layer 64 is formed so as to cover the entirety of each of the second conductive pads 62, a sufficient amount of solder can be fed to each of the second conductive pads 62, whereby the multilayer wiring board 10 can be flip-chip bonded to the semiconductor element in a more reliable manner.

Moreover, the barrier metal layer 63 is formed between each of the second conductive pads 62 and the solder layer 64 so as to cover the entirety of each of the second conductive pads 62. When the solder layer 64 is formed so as to cover the entirety of each of the second conductive pads 62, adhesion between the solder layer 64 and the second resist layer 42 is considerably low. Consequently, peeling takes place between the solder layer 64 and the second resist layer 42 prior to and subsequent to flip-chip bonding of the multilayer wiring board 10 to the semiconductor element, which may often cause a defective connection to a semiconductor element.

However, when the barrier metal layer 63 is formed between each of the second conductive pads 62 and the solder layer 64 as mentioned above, adhesion of the barrier metal layer 63 to the second resist layer 42 is sufficiently higher than adhesion of the solder layer 64 to the second resist layer 42. Moreover, the coating thickness t1 of the barrier metal layer 63 formed on the side end face 62A situated on the second resist layer 42 of each of the second conductive pads 62 is made greater than the coating thickness t2 of the barrier metal layer 63 formed on the surface 62B of each of the conductive pads 62 situated higher than the side end face 62A. Hence, enhancement of adhesion becomes more noticeable.

Therefore, prior to or subsequent to flip-chip bonding of the multilayer wiring board 10 to a semiconductor element, peeling will not take place between the barrier metal layer 63 and the second resist layer 42. As a result, peeling will not arise between the solder layer 64 and the second resist layer 42, either. Therefore, occurrence of a defective connection to a semiconductor element, or the like, can be prevented.

The thickness of the foregoing barrier metal layer 63 can be controlled by itself when the barrier metal layer 63 is formed by means of, for instance, a plating technique, or the like. For instance, when the barrier metal layer 63 is formed over each of the second conductive pads 62 by means of the plating technique, each of the second conductive pads 62 has the convex portion 622 having a continual curved surface situated above the convex portion 622. Therefore, a sheer drop is created by plating. As a result, as mentioned above, the coating thickness t1 of the barrier metal layer 63 formed on the side end face 62A of each of the second conductive pads 62 situated on the second resist layer 42 becomes greater than the coating thickness t2 of the barrier metal layer 63 formed on the surface 62B of each of the second conductive pads 62 situated higher than the side end face 62A.

In the embodiment, the solder layer 64 is formed on only the barrier metal layer 63 so as not to contact the second resist layer 42. Accordingly, for instance, the end of the solder layer 64 remaining in contact with the second resist layer 42 can be prevented from being partially peeled off.

No specific limitations are imposed on the size of the columnar portion 621 and the convex portion 622, which make up each of the second conductive pads 62, so long as the aforementioned working effect can be yielded.

The columnar portion 621 of each of the second conductive pads 62 is plated while openings of a mask pattern used for forming the second conductive pads 62 are made circular, whereby the columnar portions 621 can be formed as a predetermined plating film. In the meantime, the convex portions 622 of the respective second conductive pads 62 can be formed by means of controlling an additive that is to be included in a plating solution when plating. Moreover, the convex portions 622 can also be made by means of anisotropic etching the mask pattern after the second conductive pads 62 have been plated or increasing an etching time when the mask pattern is etched away.

Method for Manufacturing a Multilayer Wiring Board

A method for manufacturing the multilayer wiring board 10 shown in FIGS. 1 through 4 is now described. FIGS. 5 through 14 show views of an embodiment of a multilayer wiring board 10 at different stages of manufacture.

Figure 5:
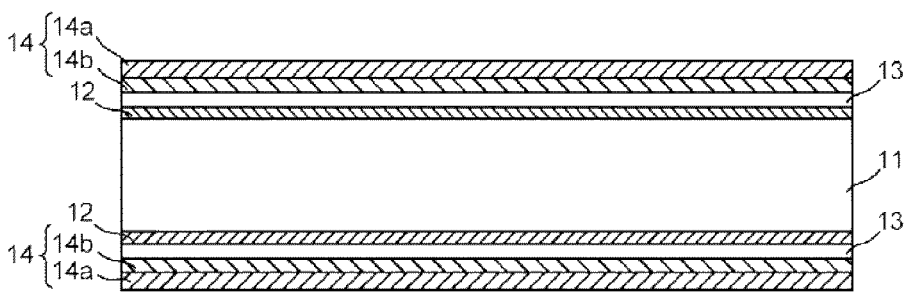
FIG. 5 shows an embodiment of the present invention at a particular stage of manufacture.

First, a support board 11 having on each side thereof a copper foil 12 is prepared as shown in FIG. 5. The support board 11 can be formed from, for instance, a heat resistant resin board (e.g., a bismaleimide triazine resin board) and a fiber reinforced resin plate (e.g., a glass fiber reinforced epoxy resin plate), or the like. Next, by way of a prepreg layer 13 serving as an adhesive layer, a peel sheet 14 is formed through pressure bonding over the copper foil 12 laid on each side of the support board 11 by means of, for instance, vacuum heat pressing.

The peel sheet 14 is formed from, for instance, a first metallic film 14a and a second metallic film 14b, and a space between the first metallic film 14a and the second metallic film 14b is plated with Cr, or the like, so that they can be peeled off from each other by means of external tensile force. The first metallic film 14a and the second metallic film 14b can be formed from copper foil.

Figure 6:
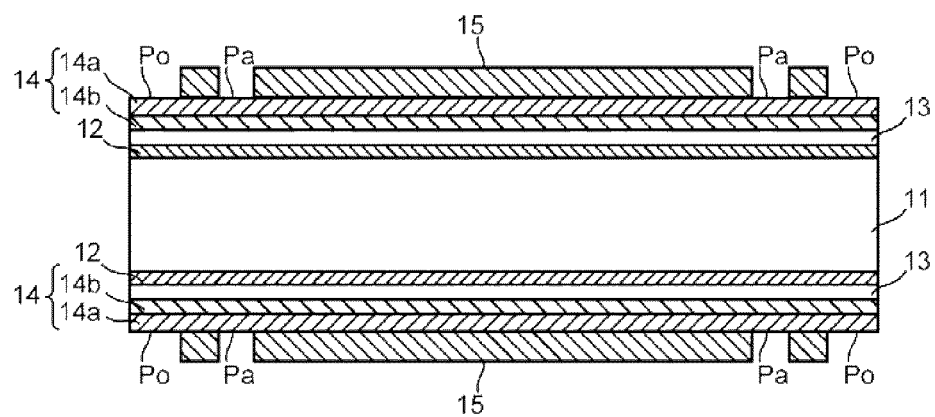
FIG. 6 shows an embodiment of the present invention at a particular stage of manufacture.

Next, as shown in FIG. 6, a photosensitive dry film is layered on the peel sheet 14 laid on either side of the support board 11 and subjected to exposure and development, thereby forming mask patterns 15. Openings equivalent to alignment mark formation portions Pa and outer periphery definition portions Po are formed in each of the mask patterns 15.

Figure 7:
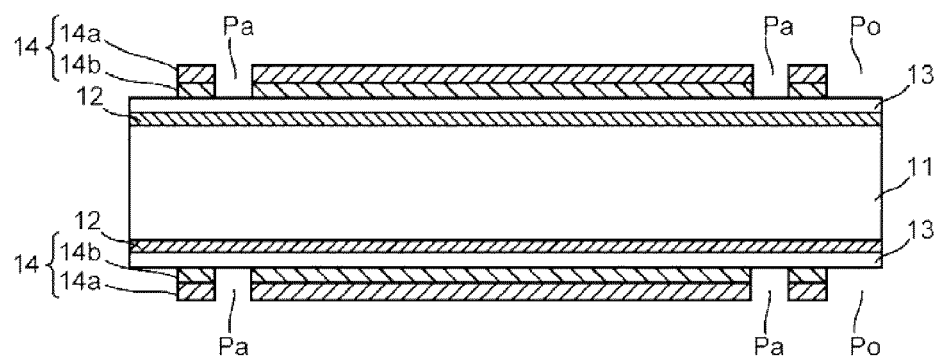
FIG. 7 shows an embodiment of the present invention at a particular stage of manufacture.

As shown in FIG. 7, the peel sheet 14 on either side of the support board 11 is etched by way of the mask pattern 15, thereby forming the alignment mark formation portions Pa and the outer periphery definition portions Po at positions equivalent to the respective openings of the peel sheet 14.

Figure 8:
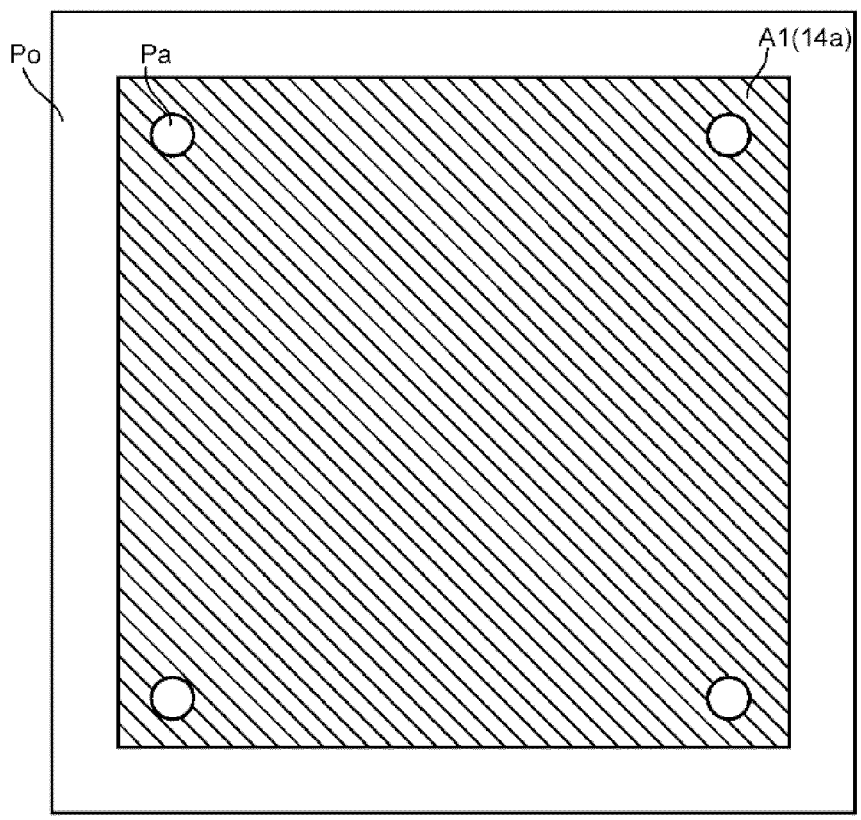
FIG. 8 shows an embodiment of the present invention at a particular stage of manufacture.

FIG. 8 is a plan view of the assembly shown in FIG. 7 viewed from above. The alignment mark formation portions Pa are formed as openings in each of the peel sheets 14 so as to make the prepreg 13 exposed. Further, the outer periphery definition portions Po are formed as cutouts that are made by cutting edges of each of the peel sheets 14 so that the prepreg 13 will become exposed.

After formation of the alignment mark formation portions Pa and the outer periphery definition portions Po, the mask patterns 15 are etched away.

It is preferable that surfaces of the respective peel sheets 14 exposed after removal of the respective mask patterns 15 be roughened by means of etching. Adhesion between each peel sheet 14 and a resin layer to be described later can thereby be enhanced.

Figure 9:
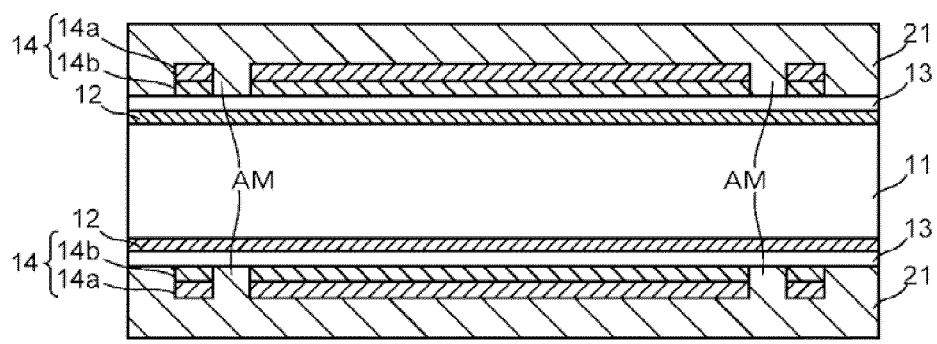
FIG. 9 shows an embodiment of the present invention at a particular stage of manufacture.

As shown in FIG. 9, a resin film is layered on each peel sheet 14 and pressurized and heated in a vacuum, to thus be cured. The first resin insulation layers 21 are thus formed. Each of the surfaces of the respective peel sheets 14 is thereby covered with the first resin insulation layer 21. The openings making up the respective alignment mark formation portions Pa and the cutouts making up the outer periphery definition portions Po are filled with the first resin insulation layer 21. A structure of an alignment mark AM is formed in each of the alignment mark formation portions Pa.

The outer peripheral definition portions Po are also covered with the first resin insulation layer 21. Therefore, of the occurrence of the following disadvantages can be eliminated. Namely, in a process for performing peeling operation by means of the peel sheets 14, which are described below, end faces (i.e. the end portions, periphery) of each peel sheet 14 will come off from (become detached from), for instance, the respective prepregs 13 (i.e., to thus be uplifted or turned up at the periphery). This will make it difficult to perform processing pertaining to the peel process without fail, so that manufacture of the intended multilayer wiring board 10 is difficult or not impossible.

Figure 10:
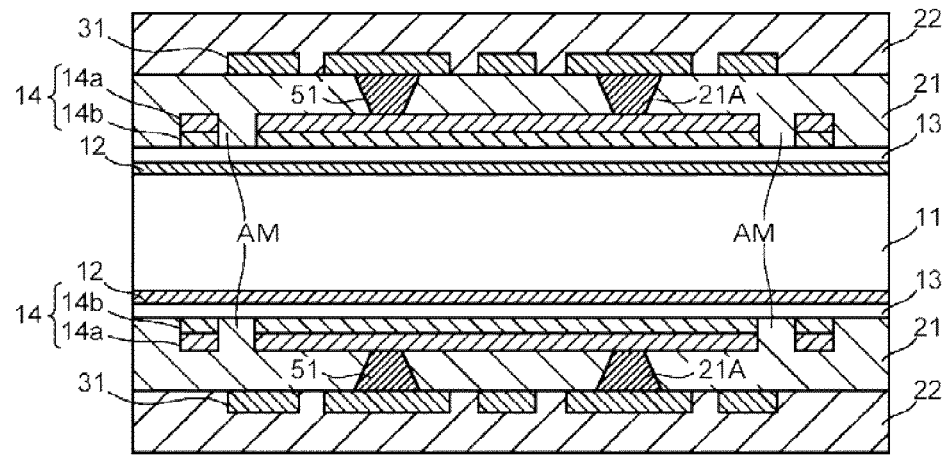
FIG. 10 shows an embodiment of the present invention at a particular stage of manufacture.

Next, as shown in FIG. 10, the first resin insulation layers 21 are exposed to a laser beam that has predetermined intensity and that originates from, for instance, a $CO_2$ gas laser or a YAG laser, to thus make the via holes 21A. Subsequently, the first resin insulation layers 21 including the via holes 21A are subjected to roughening. When the first resin insulation layers 21 include a filler, the filler will be liberated and left on the first resin insulation layer 21 if the first resin insulation layers 21 are subjected to roughening. Accordingly, the first resin insulation layers 21 are rinsed with water, as required.

The via holes 21A are then subjected to desmearing and outline etching, whereupon interiors of the respective via holes 21A are rinsed. When rinsing is implemented as mentioned above, the filler, which would otherwise still remain on the first resin insulation layers 21 during water rinsing in the desmearing process, can be removed.

Air blow operation can be performed between the rinsing operation and the desmearing operation. Even when the isolated filler is not perfectly removed by water rinsing, elimination of the filler can be complemented by means of air blow operation.

Subsequently, the first resin insulation layer 21 is subjected to pattern plating, thereby forming the first conductor layers 31 and the via conductors 51. The first conductor layers 31 and the via conductors 51 are formed as follows by means of a semi-additive technique. First, an electroless plating film is formed over each of the first resin insulation layers 21. Subsequently, a resist is then formed over the electroless plating film. An area on each first resin insulation layer 21 where the resist is not formed is subjected to electrolytic copper plating. After the first conductor layers 31 and the via conductors 51 have been formed, the resist is peeled and eliminated by means of KOH, or the like.

Next, after each of the first conductor layers 31 are subjected to roughening, a resin film is layered over each of the first resin insulation layers 21 so as to cover the first conductor layer 31. The thus-layered films are then pressurized and heated in a vacuum, to thus become cured. The second resin insulation layers 22 are then formed.

Figure 11:
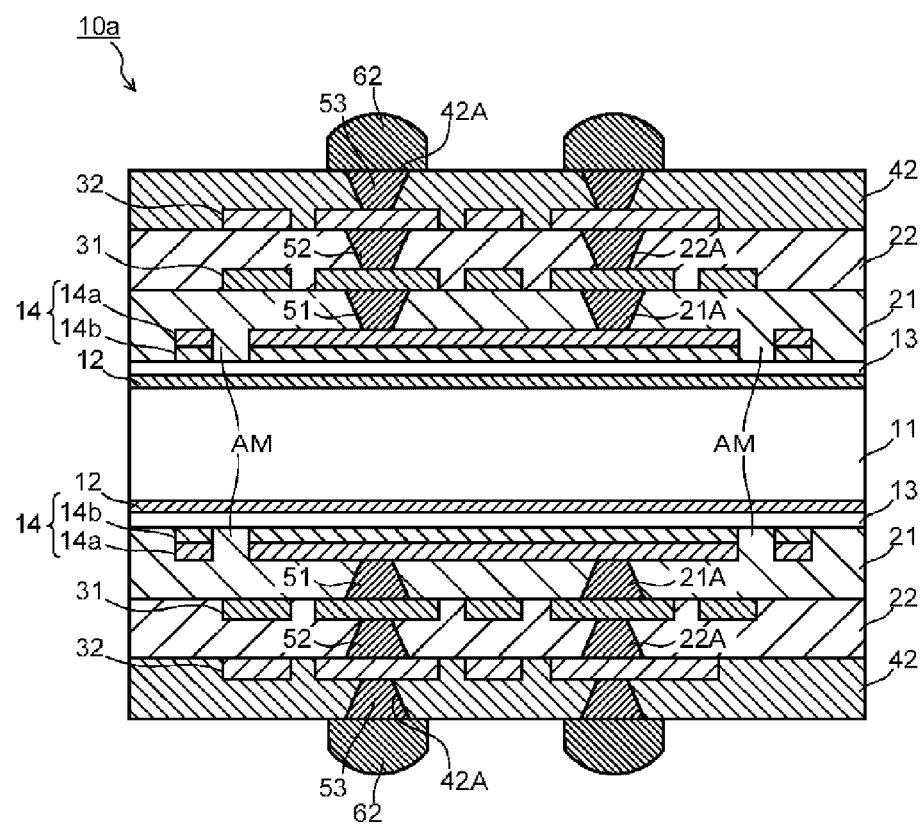
FIG. 11 shows an embodiment of the present invention at a particular stage of manufacture.

As shown in FIG. 11, the second resin insulation layers 22 are exposed to a laser beam that originates from, for instance, a $CO_2$ gas laser or a YAG laser and that has a predetermined intensity, to make the via holes 22A. Subsequently, the second resin insulation layers 22 including the via holes 22A are subjected to roughening. When the second resin insulation layers 22 include a filler, the filler will be isolated and left on the second resin insulation layers 22 if the second resin insulation layers 22 are subjected to roughening. Therefore, the second resin insulation layers 22 are rinsed with water, as required.

The via holes 22A are then subjected to desmearing and outline etching, whereupon interiors of the respective via holes 22A are rinsed. When water rising is implemented as mentioned above, the filler, which would otherwise remain on the second resin insulation layers 22 during water rinsing in the desmearing process, can be removed.

Air blow operation can be performed between the rinsing operation and the desmearing operation. Even when the isolated filler is not perfectly removed by water rinsing, elimination of the filler can be complemented by means of air blow operation.

Subsequently, the second resin insulation layer 22 is subjected to pattern plating to thereby form the second conductor layers 32 and the via conductors 52 by means of the semi-additive technique, in much the same way as are the first conductor layers 31.

Next, the second resist layer 42 is formed over the respective second resin insulation layers 22. Each of the second resist layers 42 is subjected to exposure and development by way of a predetermined mask, thereby forming the openings 42A. Subsequently, the second conductive pads 62 and the via conductors 53 are formed by means of a semi-additive technique, as in the case of the first conductor layers 31.

Since each of the second conductive pads 62 is made up of the columnar portion 621 and the convex portion 622, the columnar portions 621 are formed as a predetermined plating film by means of plating the second conductive pads 62 while the openings of the mask pattern used for forming the second conductive pads 62 are made circular. Further, the convex portions 622 are formed by controlling an additive included in a plating solution used when plating is performed. The convex portions 622 can also be formed by performing anisotropic etching or increasing an etching time when the mask pattern is etched away after the second conductive pads 62 have been formed through plating.

Figure 12:
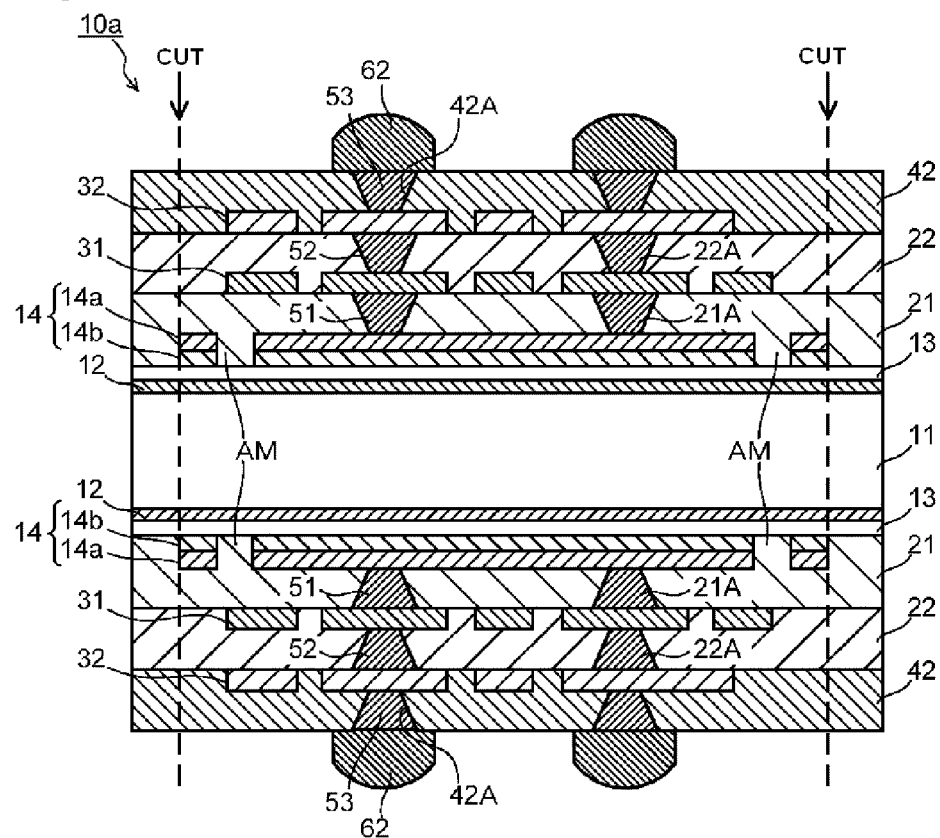
FIG. 12 shows an embodiment of the present invention at a particular stage of manufacture.

As shown in FIG. 12, a layered product 10a manufactured through the foregoing processes is cut along a cut line set slightly inside with reference to each of the outer periphery definition portions Po, thereby eliminating an unwanted outer periphery from the layered product 10a. An effective area for a multilayer wiring board is thus defined.

Figure 13:
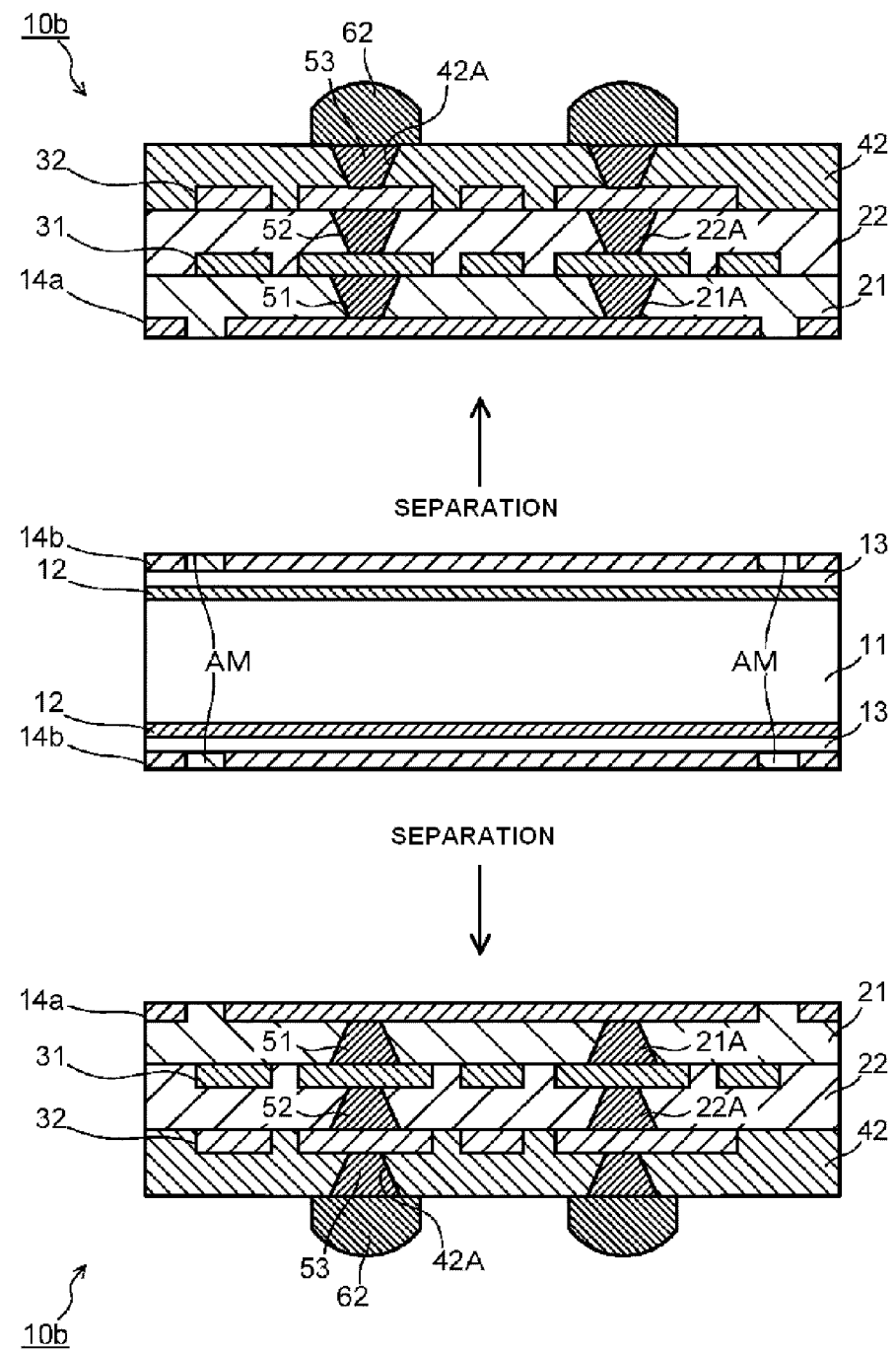
FIG. 13 shows an embodiment of the present invention at a particular stage of manufacture.

Next, after the unwanted outer periphery has been removed with reference to each of the outer periphery definition portions Po, as shown in FIG. 13, the layered product 10a is peeled along a peel interface between the first metallic film 14a and the second metallic film 14b that make up the peel sheet 14 of the layered product 10a, whereby the support board 11 is eliminated from the layered product 10a. The layered products 10b having the same structure, such as those shown in FIG. 13 are obtained.

Figure 14:
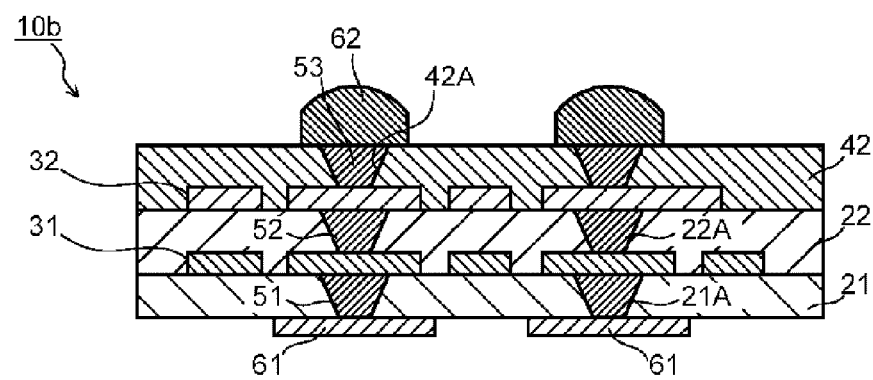
FIG. 14 shows an embodiment of the present invention at a particular stage of manufacture.

Subsequently, as shown in FIG. 14, the first metallic film 14a of the peel sheet 14 still remaining below the layered product 10b is etched, thereby forming the first conductive pads 61 on the first resin insulation layer 21. The first resist layer 41 including the openings 41A, like openings through which the first conductive pads 61 become exposed, is formed. Further, the second conductive pads 62 are sequentially subjected to, for instance, electroless Ni plating and electroless Au plating, in such a way that the entirety of each of the second conductive pads 62 is covered, to thus form the barrier metal layer 63 formed from a Ni/Au plating film. The solder layer 64 is formed so as to cover the entirety of an exposed area of the barrier metal layer 63, whereby the multilayer wiring board 10, such as that shown in FIGS. 1 through 4, is manufactured.

The alignment marks AM can be used as positional references at the time of formation of, for instance, the first resist layer 41.

In the present embodiment, the alignment marks AM are formed in the process of manufacturing the multilayer wiring board 10. However, the alignment marks AM are not necessarily required. Further, the alignment marks AM can also be formed by means of machining (e.g., like drilling) the peel sheet 14, instead of etching the peel sheet 14 as in the present embodiment.

Although the present invention has been described in detail by reference to the specific examples, the present invention is not confined to the specific embodiments mentioned above. The present invention will be capable of any and all possible modifications and alterations that do not depart from the scope of the present invention.

What is claimed is:

1. A multilayer wiring board comprising:
a build-up layer including a conductor layer and a resin insulation layer that are alternately layered;
a conductive pad that is formed so that the whole conductive pad projects from a surface of the build-up layer, the conductive pad having a columnar portion at a lower part thereof and a convex portion at an upper part thereof, a surface of the convex portion of the conductive pad forming a continual curved shape;
a barrier metal layer covering the entire conductive pad, a coating thickness of a portion of the barrier metal layer formed on a side end face of the conductive pad situated on the resin insulation layer being greater than a coating thickness of a portion of the barrier metal layer formed on a surface of the conductive pad situated at a higher position than the side end face; and
a solder layer covering the entire barrier metal layer that covers the conductive pad.

2. The multilayer wiring board according to claim 1, wherein the solder layer is formed only on the barrier metal layer and does not contact the resin insulation layer.

3. The multilayer wiring board according to claim 1, wherein a resist layer is an outermost layer of the build-up layer, and wherein the conductive pad projects from a surface of the resist layer.

* * * * *